United States Patent
Garcia

(10) Patent No.: US 12,417,866 B2
(45) Date of Patent: Sep. 16, 2025

(54) METHOD FOR CONFECTIONING RESISTORS, RESISTOR, AND HEATING DEVICE

(71) Applicant: BorgWarner Inc., Auburn Hills, MI (US)

(72) Inventor: Julio Abraham Carrera Garcia, Vigo (ES)

(73) Assignee: BorgWarner Inc., Auburn Hills, MI (US)

( * ) Notice: Subject to any disclaimer, the term of this patent is extended or adjusted under 35 U.S.C. 154(b) by 943 days.

(21) Appl. No.: 17/554,739

(22) Filed: Dec. 17, 2021

(65) Prior Publication Data

US 2023/0162895 A1 May 25, 2023

(30) Foreign Application Priority Data

Nov. 25, 2021 (EP) .................................. 21210554

(51) Int. Cl.
*H01C 17/00* (2006.01)
*B23K 26/351* (2014.01)
*F24H 9/1818* (2022.01)
*G01R 31/01* (2020.01)
*H01C 1/01* (2006.01)
*H01C 1/14* (2006.01)

(52) U.S. Cl.
CPC ........... *H01C 17/00* (2013.01); *B23K 26/351* (2015.10); *G01R 31/013* (2013.01);
(Continued)

(58) Field of Classification Search
CPC ...... H01C 17/00; H01C 1/1406; H01C 7/021; H01C 1/01; H01C 17/24; B23K 26/351;
(Continued)

(56) References Cited

U.S. PATENT DOCUMENTS 2,382,024 A    8/1945   Priessman
5,798,685 A    8/1998   Katsuki et al.
(Continued)

FOREIGN PATENT DOCUMENTS

CN      1140887 A    1/1997
CN    103606426 B    4/2016
(Continued)

OTHER PUBLICATIONS

IP.com search history (Year: 2025).*

*Primary Examiner* — Elizabeth M Kerr
*Assistant Examiner* — Keith Brian Assante
(74) *Attorney, Agent, or Firm* — Bose McKinney & Evans LLP

(57) ABSTRACT

This disclosure refers to a method for confectioning resistors that each comprise a PTC ceramic plate and metallic electrode layers covering opposite faces of the ceramic plate, said method comprising the following steps: measuring an electrical resistance of a resistor to be confectioned by applying an electrical potential to one of electrode layers such that an electric current flows from one of the electrode layers through the ceramic plate to the electrode layer on the opposite face of the ceramic plate, comparing the measured resistance to a target resistance, and removing, if the measured resistance is lower than the target resistance, a section of at least one of the electrode layers. This disclosure also refers to such a resistor and a heating device comprising such resistors.

6 Claims, 4 Drawing Sheets

(51) Int. Cl.
  *H01C 7/02* (2006.01)
  *H01C 17/24* (2006.01)
  *H05B 3/06* (2006.01)
  *H05B 3/44* (2006.01)

(52) U.S. Cl.
  CPC .......... *H01C 1/1406* (2013.01); *H01C 7/021* (2013.01); *H05B 3/06* (2013.01); *H05B 3/44* (2013.01); *F24H 9/1827* (2013.01); *H01C 1/01* (2013.01); *H01C 17/24* (2013.01); *H05B 2203/017* (2013.01); *H05B 2203/02* (2013.01)

(58) Field of Classification Search
  CPC .......... G01R 31/013; H05B 3/06; H05B 3/44; H05B 2203/017; H05B 2203/02; F24H 9/1827
  See application file for complete search history.

(56) References Cited

U.S. PATENT DOCUMENTS

| | | | |
|---|---|---|---|
| 6,556,123 B1 * | 4/2003 | Lwao | H01C 1/1406 338/254 |
| 8,026,787 B2 | 9/2011 | Choi et al. | |
| 9,007,166 B2 | 4/2015 | Tseng et al. | |
| 9,401,234 B2 | 7/2016 | Tseng et al. | |
| 2013/0200989 A1 * | 8/2013 | Miura | H01C 7/18 338/22 SD |
| 2015/0362455 A1 * | 12/2015 | Moore | G01N 27/3272 29/610.1 |
| 2016/0125981 A1 * | 5/2016 | Kim | H01C 1/14 338/325 |
| 2016/0264100 A1 * | 9/2016 | Gong | H05B 3/04 |
| 2017/0064834 A1 * | 3/2017 | Hattori | H01G 2/065 |
| 2017/0271056 A1 | 9/2017 | Hirata et al. | |
| 2017/0290164 A1 * | 10/2017 | Feichtinger | H01C 1/148 |
| 2019/0080825 A1 * | 3/2019 | Chen | C08K 3/14 |
| 2019/0084374 A1 * | 3/2019 | Min | F24H 9/1872 |
| 2019/0387581 A1 | 12/2019 | Kohl et al. | |
| 2023/0162894 A1 * | 5/2023 | Endo | H01C 1/144 338/49 |

FOREIGN PATENT DOCUMENTS

| | | |
|---|---|---|
| CN | 110617620 A | 12/2019 |
| DE | 701 380 C | 5/1942 |
| DE | 196 23 857 C2 | 9/2002 |
| EP | 0 730 283 B1 | 12/2001 |

* cited by examiner

METHOD FOR CONFECTIONING RESISTORS, RESISTOR, AND HEATING DEVICE

RELATED APPLICATIONS

This application claims priority to European Patent Application No. 21 210 554.8, filed Nov. 25, 2021, the entire disclosure of which is hereby incorporated herein by reference.

BACKGROUND AND SUMMARY

This disclosure teaches a method for confectioning resistors comprising a PTC ceramic plate that is covered on opposite sides with a metallic electrode layer. This disclosure also refers to a resistor and a heating device.

PTC (positive temperature coefficient) materials show a marked in increase of their electrical resistivity above a critical temperature. Heating devices comprising such resistors, e.g., on the basis of barium titanate, are therefore inherently protected from overheating as an increase in temperature beyond a critical temperature leads to a marked increase of the electrical resistance and therefore a correspondingly reduced heating power.

A disadvantage of such resistors is that the electric resistance as measured from one electrode layer to the opposite electrode layer at a given temperature varies very much from one production batch to another, sometimes even within one production batch. This creates problems for heating devices that contain several such resistors as the electrical resistance and therefore the heating power must not vary too much within a heating device.

In the prior art, this problem is dealt with by measuring the electrical resistance of every resistor and by sorting the resistors into classes based on the measured resistance at a given temperature, e.g., at 20° C., or based on the minimum resistance of the resistor's resistance-temperature characteristic (coefficient). For example, resistors with a resistance of more than 1000Ω may be classified as D, resistors with 800Ω to 1000Ω classified as C resistors with 600Ω to 800Ω classified as B and resistors with less than 600Ω classified as A. In order to achieve a specified heating power, a defined number of A and B resistors can be used in a heating device. For a given application, e.g., a heating device for heating the passenger compartment of a vehicle, resistors of classes A and D often deviate too much from the ideal resistance such that they cannot be used and are discarded. Useless resistors of classes A and D therefore increase overall manufacturing costs significantly.

Economically manufacturing resistors with smaller variations in electrical resistance would be desirable, but is at present an unsolved problem.

SUMMARY

This disclosure teaches how suitable resistors that each comprise a PTC ceramic plate and two electrode layers covering opposite faces of the PTC ceramic plate can be provided at lower costs for heating devices like air heaters for the passenger cabin of vehicles. This disclosure also shows how manufacturing costs for heating devices suitable for heating the passenger compartment of a vehicle can be reduced.

This disclosure provides a method for confectioning resistors that each comprise a PTC ceramic plate and two electrode layers covering opposite faces of the plate such that more resistors of a given production batch have an electrical resistance within useful specifications. As a consequence, fewer resistors have to be discarded as unusable and production costs can be reduced. Moreover, heating devices can be provided wherein heat production is more homogeneous as the electric resistances of the resistors of the heating device are more similar to each other.

The method comprises a step of measuring the electrical resistance for an electric current flowing from one metallic electrode layer through the ceramic plate to the opposite metallic electrode layer. This measured resistance is then compared to a target resistance and, if the measured resistance is below the target resistance, a section of at least one of the electrode layers is removed. A smaller electrode layer leaves part of the ceramic plate uncovered and thereby leads to an increase of the electrical resistance for a current that is caused by an electrical potential applied to the metallic electrode layer.

Sections of the plate that are not covered by the metallic electrode layer hardly contribute to the total current. The larger a section of the metallic electrode is removed, the smaller the volume of the ceramic plate through which electric current flows. By removing part of the metallic electrode(s) the electric resistance of the resistor can therefore be improved.

If the measured resistance of a resistor is below the target resistance, the resistance can be increased by removing part(s) of one electrode layer or of both electrode layers. By confectioning resistors according to this disclosure, fewer resistors have to be discarded for having a resistance outside of a given range. Moreover, the distribution of resistances after confectioning is much narrower.

In an advantageous refinement of this disclosure, a rim section of the metallic electrode layer is removed if the measured resistance is lower than the target resistance. For example, a rim section of the metallic electrode layer may be removed in such a way that a strip-shaped rim section of the ceramic plate is no longer covered by the metallic electrode. Good results can be achieved by removing two strip-shaped sections of the metallic electrode layer, for example strip-shaped sections adjacent to opposite edges of a rectangular ceramic plate.

In another advantageous refinement the electrode layer covers 40% to 90% of a face of the resistor. Preferably, the electrode layer covers at most 80%, for example 70% or less, of this face of the resistor. Preferably, the electrode layer covers at least 50%, for example 55% or more, of this face of the resistor.

In another advantageous refinement, both metallic electrode layers are congruent. This means that the same section or sections are removed from both metallic electrode layers. Hence, a geometric projection of one of the electrode layers perpendicular to the plane defined by this electrode layer matches the other electrode layer. In use, heat is then produced more homogenously in the part of the ceramic plate that is covered by the metallic electrode layers. Preferably, the size of the two electrode layers of a resistor according to this disclosure differs by less than 20%, e.g., by 10% or less.

In another advantageous refinement of this disclosure removal of sections of the metallic electrode layers is done by laser ablation. In this way, removal can be done quickly, thoroughly and cost efficiently. However, other methods may also be used for removing sections of the metallic electrode layers, e.g., mechanical methods, especially abrasive methods, or chemical methods, especially etching.

Before the confectioning process, all resistors of a production batch agree in their mechanical dimensions within manufacturing tolerances and all metallic electrode layers cover areas of the same size. After the confectioning process, the various resistors differ visibly in the size of their metallic electrode layers. In some resistors the metallic electrode layer may still cover a face of the ceramic plate completely, in other resistors different sized sections of the metallic electrode layers may have been removed.

Thus, a heating device according to this disclosure comprises several resistors that each comprise a PTC ceramic plate and metallic electrode layers covering opposite faces of the plate, wherein in at least some of the resistors a first and/or a second face of the plate is only covered in part by the respective electrode layer, for example the largest electrode layer may be at least 10% larger than the smallest electrode layer, e.g., 20% larger than the smallest electrode layer.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein.

DESCRIPTION

The embodiments described below are not intended to be exhaustive or to limit the invention to the precise forms disclosed in the following description. Rather, the embodiments are chosen and described so that others skilled in the art may appreciate and understand the principles and practices of this disclosure.

Figure 1:
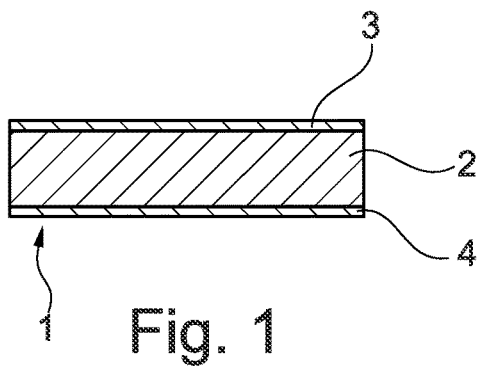
FIG. 1 shows schematically a cross-section of an example of a resistor.

FIG. 1 shows schematically in a cross-section a resistor 1 that comprises a PTC ceramic plate 2 and metallic electrode layers 3, 4 covering opposite faces of the ceramic plate 2. The ceramic plate may, e.g., be of the basis of barium titanate, the electrode layers 3, 4, e.g., of aluminum.

Figure 2:
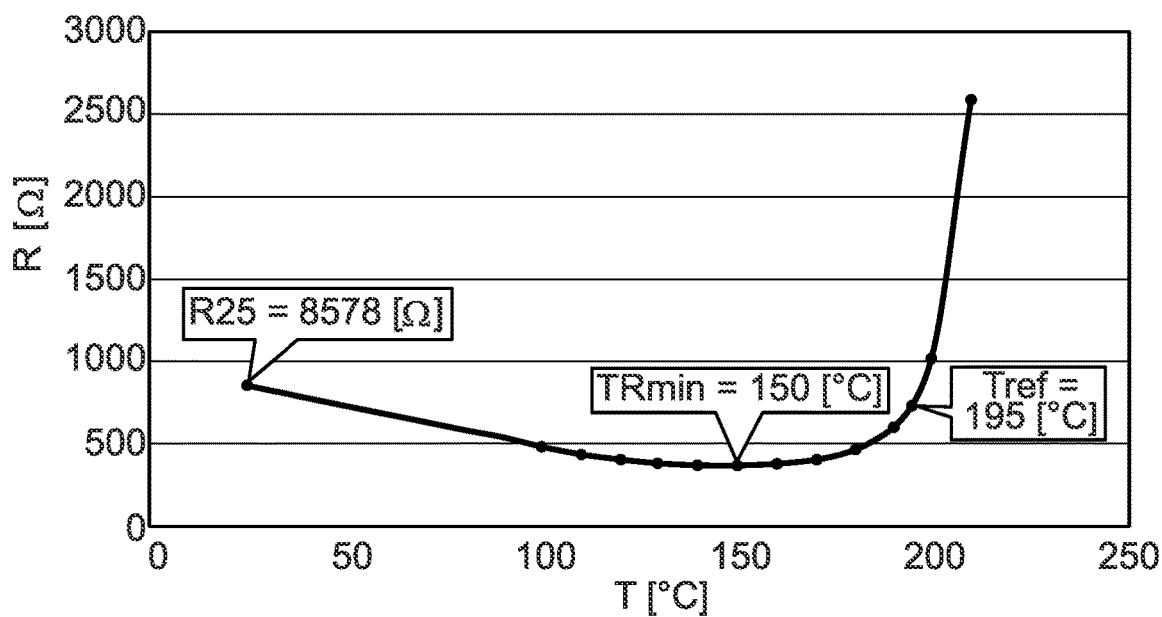
FIG. 2 shows an example of a resistance-temperature characteristic of such a resistor.

FIG. 2 shows an example of the resistance-temperature characteristic of a resistor as shown in FIG. 1. The abscissa shows temperature T in degrees Celsius and the ordinate resistance R in Ohm. The resistance-temperature characteristic of PTC ceramics generally looks like the example shown in FIG. 2. An increase in temperature initially leads to a slow reduction in resistance R until a minimum resistance $R_{min}$ is reached, in the example shown at a temperature $T_{Rmin}$ of about 150°. Further increase in temperature leads to an increase in resistance that is at first rather slow and accelerates drastically as soon as critical temperature $T_{ref}$ is reached. In the example shown, the critical temperature is about 195° C.

Both the temperature $T_{Rmin}$ at which the resistance is minimal and the temperature $T_{ref}$ at which resistance starts to rise rapidly with increasing temperature are dependent on the composition of the PTC ceramic and can be changed by the addition of dopants to barium titanate, for example.

Figure 3:
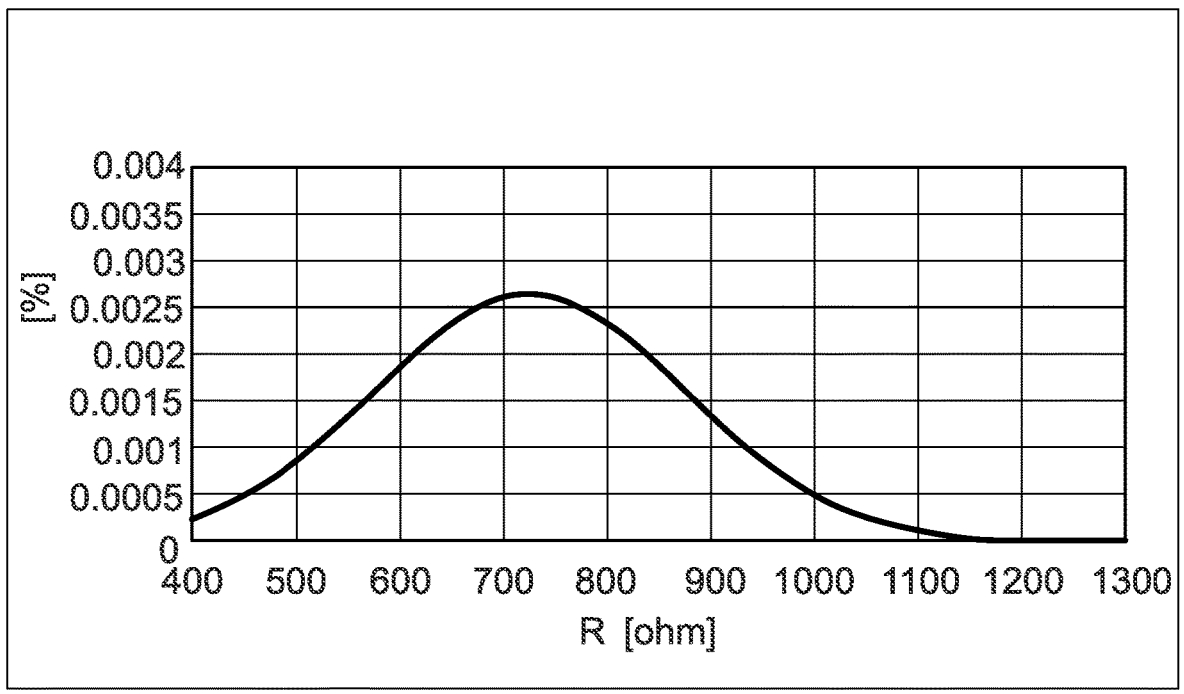
FIG. 3 shows an example of the distribution of the minimum resistance $R_{min}$ of such resistors.

The resistance at a given temperature, e.g., 25° C., as well as the temperature $T_{Rmin}$ at which the resistance is minimal varies significantly from one production batch to another and even with production batches. FIG. 3 shows a typical distribution of the minimum resistance $R_{min}$ for such resistors. In FIG. 3 the resistance is given in Ohm on the abscissa and the probability density in percent on the ordinate. As can be seen resistances are spread over a large range such that some resistors have resistances that are more than twice as other resistances of other resistors. Such large differences in resistance are problematic for many applications. The resistors are therefore confectioned in order to make this distribution narrower. By confectioning, as described below, the resistivity of resistors that have a rather low resistance can be increased.

Figure 4:
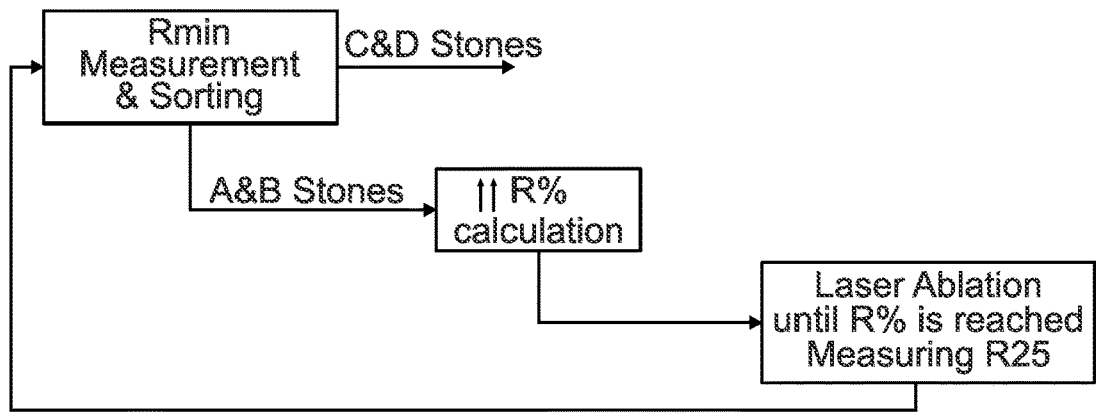
FIG. 4 shows a flow chart of a method for confectioning such resistors.

FIG. 4 shows a flow chart of a method for confectioning such resistors. In a first step a resistance of the resistor is measured, for example at a defined temperature like 25° C., or the minimum resistance $R_{min}$. Based on these measurements resistors are then sorted into classes, for example resistors with a resistance below 600Ω are classed as A, resistors of 600Ω to 800Ω are classed as B, resistors of 800Ω to 1000Ω are classed as C, and resistors above 1000Ω as D.

Stones of class A and B are then confectioned in order to raise their resistance by removing sections of their metallic electrode surfaces 3 and/or 4. The larger the area of the metallic electrodes 3, 4 that is removed, the more the resistance is increased. By comparing the measured resistance to a target resistance, it is determined how much the surface area of the ceramic plate that is covered by metallic electrode layers 3, 4 is to be reduced. Then one or more sections of the metallic electrode layers 3, 4 are reduced, e.g., by laser ablation.

Figure 5:
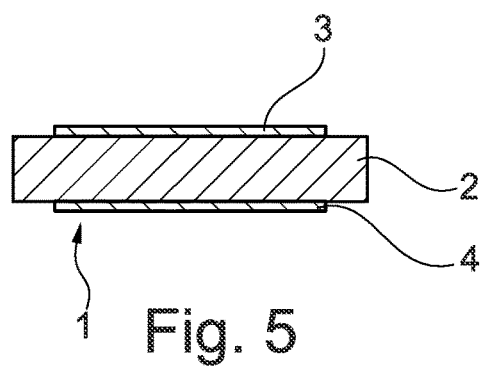
FIG. 5 shows schematically a cross-section of an example of a resistor after confectioning.

For example, strip-shaped sections adjacent to an edge of the ceramic plate may be reduced. FIG. 5 shows schematically a resistor 1 after confectioning by removing sections of the metallic electrode layers 3, 4. In FIG. 5, corresponding sections were removed from both metallic electrode layers 3, 4, but an increase in resistance can also be achieved if only part of one electrode layer is removed and the other electrode layer still completely covers a face of the ceramic plate 2. During confectioning the area of the electrode layer 3, 4 is reduced by at least 10%, often by 15% or more, e.g., by 20% or more or even 25% or more. Thus in most confectioned resistors at most 90% of the area of the first face and/or of the second face of the ceramic plate 2 is covered by the respective electrode layer 3, 4. After confectioning usually 40% to 90% of the area of the first face and/or of the second face of the ceramic plate 2 is covered by the respective electrode layer 3, 4. After confectioning, in most stones 50% to 70% of the area of the first face and/or of the second face of the ceramic plate 2 may be covered by the respective electrode layer 3, 4.

Figure 6:
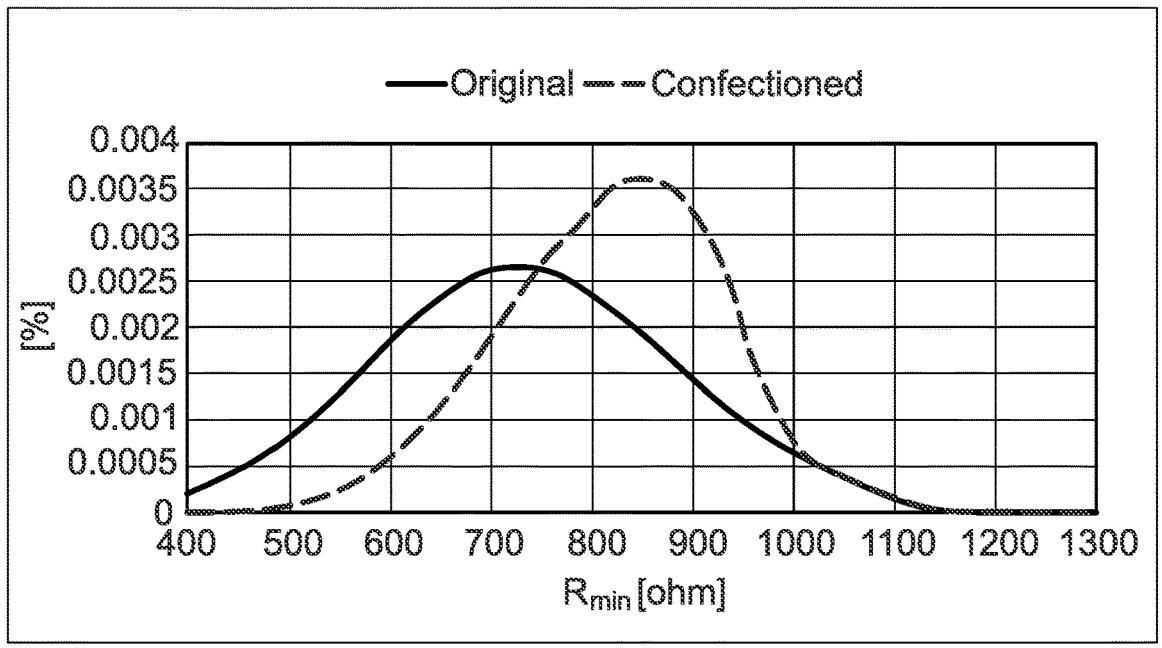
FIG. 6 shows schematically an example of the distribution of the minimum resistance $R_{min}$ of such resistors after confectioning and also the distribution of the minimum resistance $R_{min}$ of such resistors before confectioning as shown in FIG. 3.

In FIG. 6 the distribution of the minimum resistance $R_{min}$ is shown schematically both before confectioning and after confectioning. The continuous line is the same as in FIG. 3 and shows the probability distribution of resistance. The dotted line shows schematically the probability distribution of resistance after confectioning. In the example shown, only resistors of classes A and B, i.e., resistors having a minimum resistance $R_{min}$ below 800Ω were confectioned in order to raise their minimum resistivity into the useful range of 800Ω to 1000Ω, e.g., by using a target minimum resistance of 900Ω.

Figure 8:
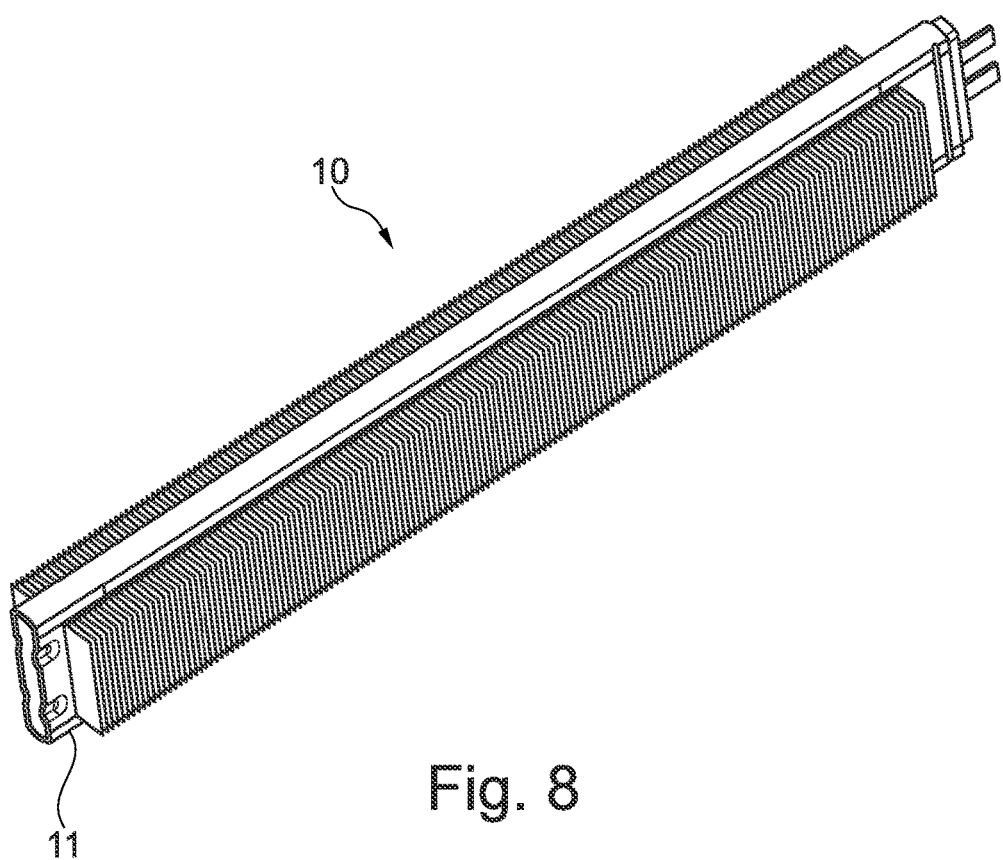
FIG. 8 shows a sub-assembly of the heating device of FIG. 7.
Figure 9:
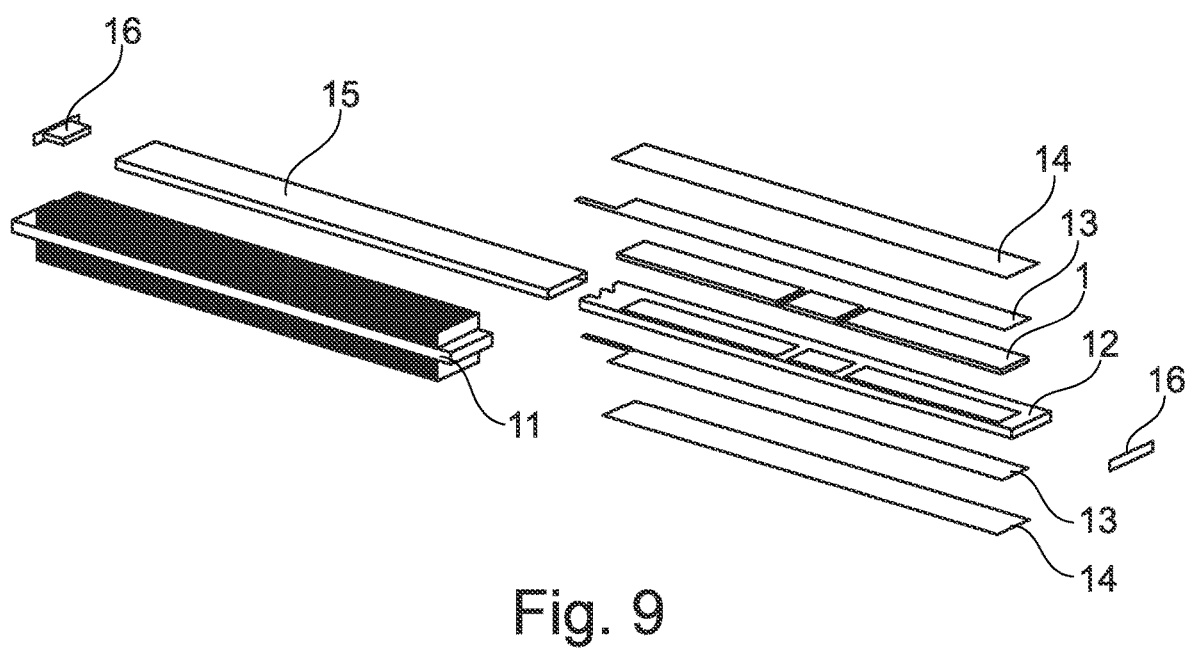
FIG. 9 shows some components of the sub-assembly of FIG. 8.

As a comparison of the two curves in FIG. 6 shows, confectioning greatly increases the percentage of resistors that have a minimum resistance $R_{min}$ inside the range of 600Ω to 1000Ω, which is the usable range for a heating device as explained in connection with FIGS. 7 to 9 below. Thus confectioning resistors greatly reduces waste and lowers overall production costs. Of course, different applications might require resistors that have other resistances, but any application usually sets a range of usable resistance that is only met by a part of as-produced resistors without confectioning.

FIG. 6 shows an example wherein the target resistance for the confectioning process was set well with the probability distribution such that only about two thirds of the resistors initially had a resistance below the target resistance. However, the target resistance might also be set higher so that a much larger percentage of all resistors initially have a resistance that is below the target resistance. It is even possible to set the target resistance so high that all or almost all resistors are subjected to the confectioning process wherein a section of their metallic electrode layer is removed.

Figure 7:
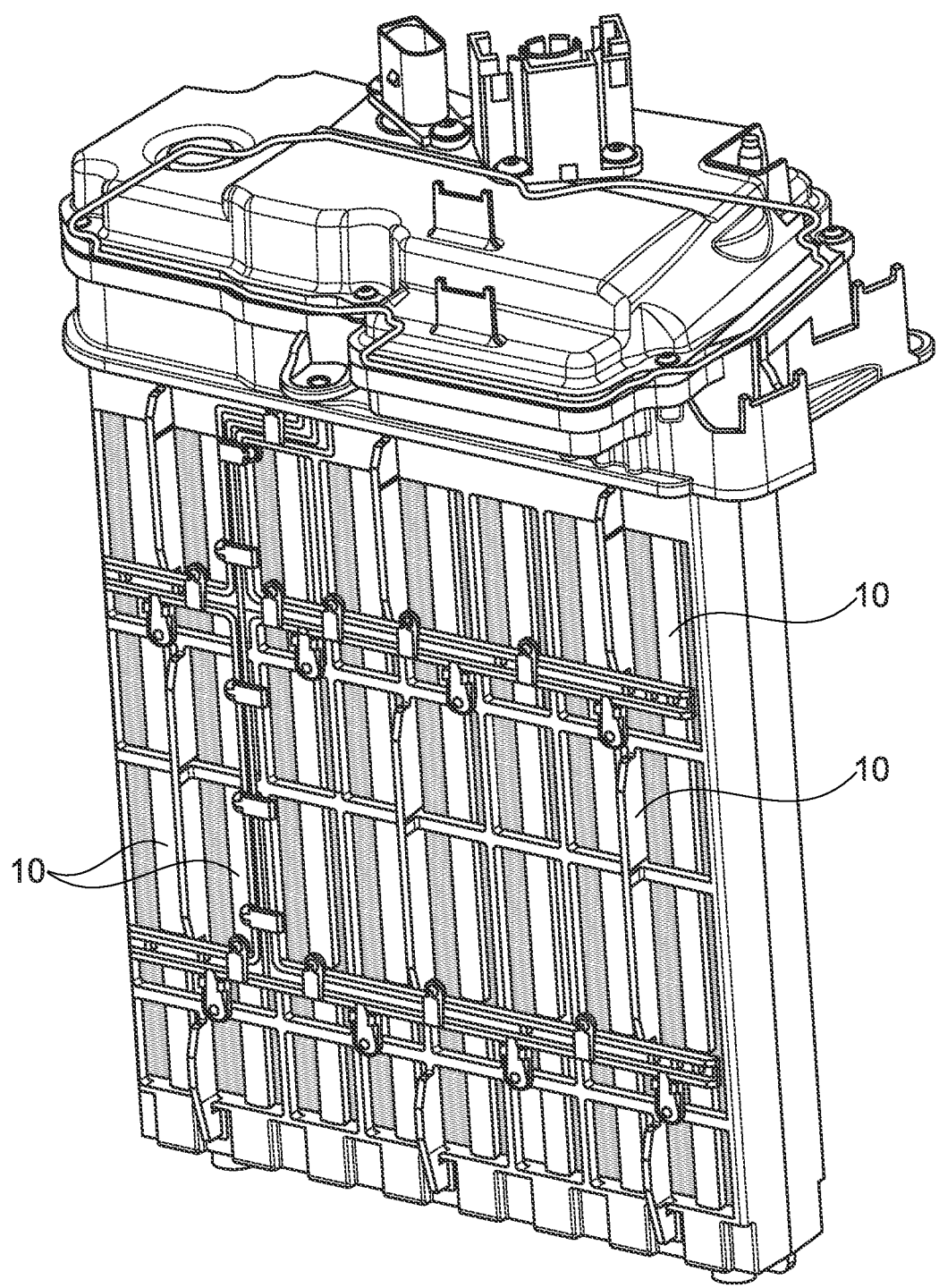
FIG. 7 shows an embodiment of a heating device.

FIG. 7 shows a heating device for heating the interior a passenger compartment of a car. In use, an air stream flows through the heating device and is thereby heated. The heating device comprises several sub-assemblies, namely heating rods 10 as shown in FIG. 8. FIG. 9 shows an exploded view of a heating rod 10.

The heating rod 10 comprises a tube 11 provided with a plurality of fins. The fins might be an integral part of the tube, for example the fins might be produced by skiving, or provided as separate parts, e.g., sheets fixed to the tube 11. Inside the tube 11 are resistors 1, e.g., seven resistors 1, that were confectioned as explained above. The resistors 1 are held by a frame 12 and electrically contacted by metallic sheets 13 arranged above and below the resistors 1 such that the sheets 13 contact the metallic electrode layers 3, 4 of the resistors 1 (see FIGS. 1 and 5).

As the resistors 1 have been through a confectioning process according to FIG. 4, some sections of the metallic electrode layers 3, 4 have been removed and the contact sheets 13 also touch some areas of the resistors 1 where the ceramic plate 2 is not covered by the metallic electrode layer 3, 4. Although the metallic sheets 13 touch the ceramic plate 2 directly in such places, only negligible electrical contact is created directly between the ceramic plate 2 and the metallic contact sheets. In use, almost all current that flows from one of the contact sheets 13 to the other contact sheet flows through the electrode layers 3, 4. Hence, it is usually not necessary to place electrical insulation on sections of the ceramic plate 2 where the electrode layer 3, 4 has been removed.

The contact sheets 13 are covered on the side facing away from the resistors 1 with electrically insulating ceramic strips 14, e.g., alumina. In addition, the package comprising the resistors 1, the frame 12, the contact sheets 13, and the insulating sheets 14 may be wrapped in an electrically insulating film 15. The ends of the tube 11 may be closed with plugs 16 stuck into the tube 11.

As the heating device explained above comprises resistors 1 that have confectioned by a process according to FIG. 4, these resistors 1 differ in the size of their electrode layers 3, 4. All resistors 1 have the same mechanical dimensions within manufacturing tolerances. That is the ceramic plates 2 of all resistors 1 have essentially the same size. In some of these resistors, the electrode layers 3, 4 might cover opposite faces of the ceramic plate 2 completely, but in some resistors parts of the electrode layers 3, 4 have been removed such that some sections of the sides that face the contact sheets 13 are free from electrode layers 3, 4.

Usually, the area of the largest electrode layer 3, 4 of such a heating device is at least 10% larger than the area of the smallest electrode layer 3, 4. In some embodiments. The area of the largest electrode layer may even be 120% or more of the area of the smallest electrode layer.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

LIST OF REFERENCE SIGNS 1 resistor
2 PTC ceramic plate
3 electrode layer
4 electrode layer
10 heating device
11 tube
12 frame
13 electrode sheet
14 insulating strip
15 insulating film
16 plug

What is claimed is:

1. A method for confectioning resistors that each comprise a PTC ceramic plate and metallic electrode layers covering opposite faces of the ceramic plate, said method comprising:
   measuring an electrical resistance of each resistor to be confectioned by applying an electrical potential to one of the electrode layers such that an electric current flows from the one electrode layer through the ceramic plate to the electrode layer on the opposite face of the ceramic plate;
   comparing the measured resistance to a target resistance;
   identifying at least one resistor wherein the measured resistance is lower than the target resistance; and
   removing a section of at least one of the electrode layers of the at least one resistor as a function of a difference between the target resistance and the measured resistance.

2. The method according to claim 1, wherein the section of at least one of the electrode layers that is removed, if the measured resistance is lower than the target resistance, is a rim section.

3. The method according to claim 1, wherein a section of both electrode layers is removed if the measured resistance is lower than the target resistance.

4. The method according to claim 3, wherein both electrode layers are congruent.

5. The method according to claim 1, wherein the area of the removed section increases as the difference between the target resistance and the measured resistance increases.

6. The method according to claim 1, wherein the section of the electrode layer is removed by laser ablation.

* * * * *